United States Patent [19]
Erdelyi et al.

[11] Patent Number: 6,118,261
[45] Date of Patent: Sep. 12, 2000

[54] SLEW RATE CONTROL CIRCUIT

[75] Inventors: Charles Karoly Erdelyi, Essex Junction; John Edwin Gersbach, Burlington, both of Vt.

[73] Assignee: International Business Machines Corp., Armonk, N.Y.

[21] Appl. No.: 08/148,452

[22] Filed: Nov. 8, 1993

[51] Int. Cl.$^7$ .............................. G05F 3/16; H02M 3/18
[52] U.S. Cl. .......................... 323/313; 323/275; 307/110
[58] Field of Search .................................. 307/107, 110; 320/1; 323/313, 314, 275

[56] References Cited

U.S. PATENT DOCUMENTS

| | | | |
|---|---|---|---|
| 3,796,943 | 3/1974 | Nelson et al. | 323/9 |
| 4,558,242 | 12/1985 | Tuthill et al. | 307/577 |
| 4,972,136 | 11/1990 | Banura | 323/275 |
| 4,987,324 | 1/1991 | Wong et al. | 307/451 |
| 5,023,614 | 6/1991 | Fung et al. | 341/144 |
| 5,182,497 | 1/1993 | Yamate et al. | 315/383 |
| 5,184,129 | 2/1993 | Fung et al. | 341/144 |
| 5,237,209 | 8/1993 | Brewer | 307/110 |

*Primary Examiner*—Peter S. Wong
*Assistant Examiner*—Bao Q. Vu
*Attorney, Agent, or Firm*—Thornton & Thornton; Francis J. Thornton

[57] ABSTRACT

A noise limited, video, digital to analog converter having an output transition time control with multiple discrete transition times. This is accomplished by a DAC control circuit in which the slew rate of the current is controlled by providing set current levels in the inverters that drive the DAC output current switches thus limiting the current available for charging and discharging the capacitance on the nodes which control the output signal. Additional control is provided by voltage clamping of these nodes which reduces the input voltage to the analog output and results in a cleaner output waveform.

By so regulating and controlling the charging and discharging of these nodes, the variations in operation of the circuit due to the process used to produce the circuit in integrated form as well as temperature and supply voltage are further substantially reduced.

23 Claims, 3 Drawing Sheets

SLEW RATE CONTROL CIRCUIT

FIELD OF THE INVENTION

This invention relates to digital-to-analog (DAC) convertors and more particularly to control circuits in such convertors for controlling current turn-on or turnoff rates, i.e., the "slew rates".

BACKGROUND OF THE INVENTION

The output waveform of a video digital analog convertor (DAC) may contain current changes or steps that cause radiation of electromagnetic waves. This radiation can interfere with other communication and control signals in the same RF bands. One method of reducing such unwanted emissions is by reducing the harmonic content of the video signal.

Many attempts to address problems of this nature have been tried in the past. These attempts include utilizing transistors responsive to control signals for applying a reverse biasing potential to a reference voltage transistor and a digital input transistor at a rate such that there is little surge current in the reference transistor when the DAC is switched between its sleep mode and its regular operating mode. Such a circuit is shown in U.S. Pat. No. 5,184,129, issued Feb. 3 1993, to Fung et al.

Similarly in U.S. Pat. No. 5,023,614 also issued to Fung et al, there is taught the use of a control transistor responsive to control signals for applying a reverse bias to a reference voltage transistor in each stage at a rate such that the rate of change of current in the reference voltage transistor is less than a predetermined magnitude.

SUMMARY OF THE INVENTION

The present invention is a unique DAC control circuit which not only is simpler than known circuits, but also achieves faster and better control of the slew rate of the current in such circuits. These are achieved by controlling the current available for charging or discharging the capacitance on the input signal nodes which control the DAC current switch providing the output signals. By so regulating and controlling the charging and discharging of these nodes, the current variations due to the process used to produce the circuit in integrated form as well as effects due to temperature and supply voltage are eliminated.

The present invention thus results in a noise limited, video, digital to analog converter having an output transition time control with multiple discrete transition times.

More specifically the present invention provides a DAC control circuit in which the slew rate of the current is controlled by providing set current levels in the inverters that drive the DAC output current switches thus limiting the current available for charging and discharging the capacitance on the nodes which control the output signal. This control is achieved by coupling the inverters between voltage controlled current limiting transistors. Additional control is provided by voltage clamping of these nodes which reduces the input voltage to the analog output and results in a cleaner output waveform.

Accordingly it is an object of the invention to provide a noise limited, video, digital to analog converter having an output transition time control with multiple discrete transition times.

It is another object of the invention to provide a circuit in which the slew rate of the current is controlled by limiting the current available for charging and discharging the capacitance of the nodes that control the output signals.

These and other objects and features of the present invention will become further apparent from the following description taken in conjunction with the drawings.

DESCRIPTION OF THE PREFERRED EMBODIMENT

Figure 1:
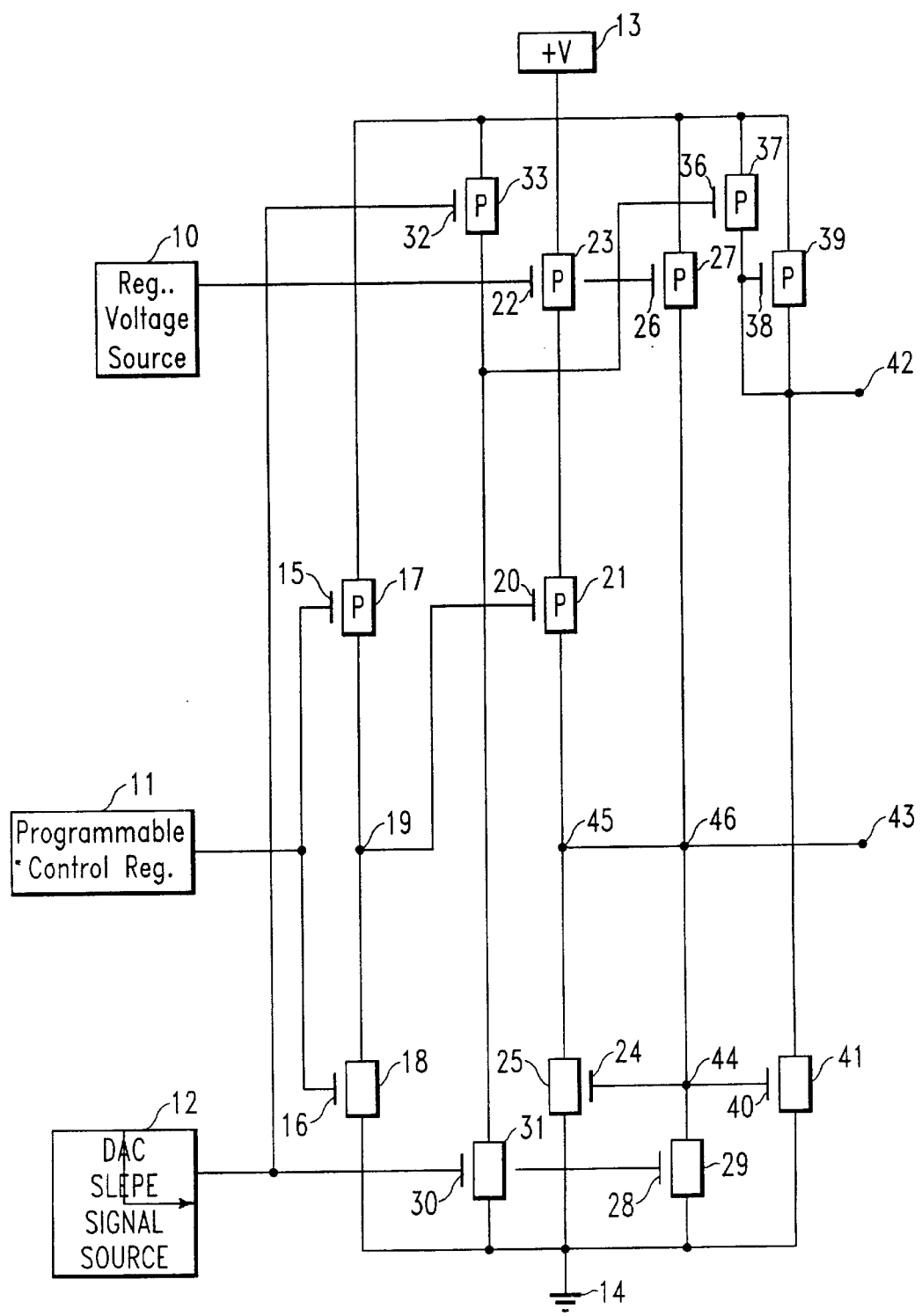
FIG. 1 is a schematic of a regulator circuit for providing selected dual reference voltages to the slew rate control circuit of FIG. 2.

FIG. 1 shows, in schematic form, a regulator circuit, suitable for use in a DAC, that will provide selected sets of reference voltages that can be applied to the input nodes of a DAC slew rate control circuit.

Figure 2:
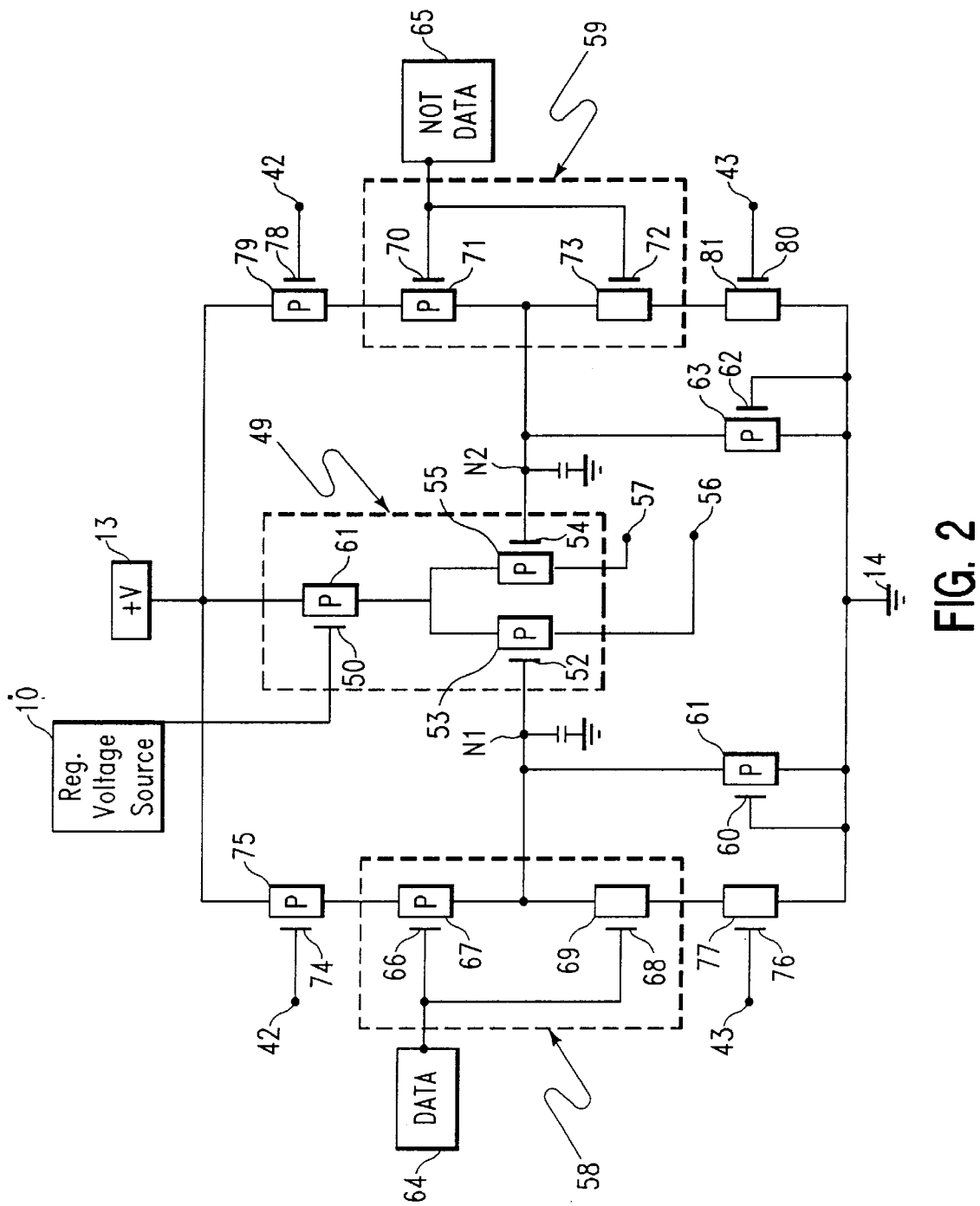
FIG. 2 is a schematic of the slew rate control circuit of the present invention.
Figure 3:
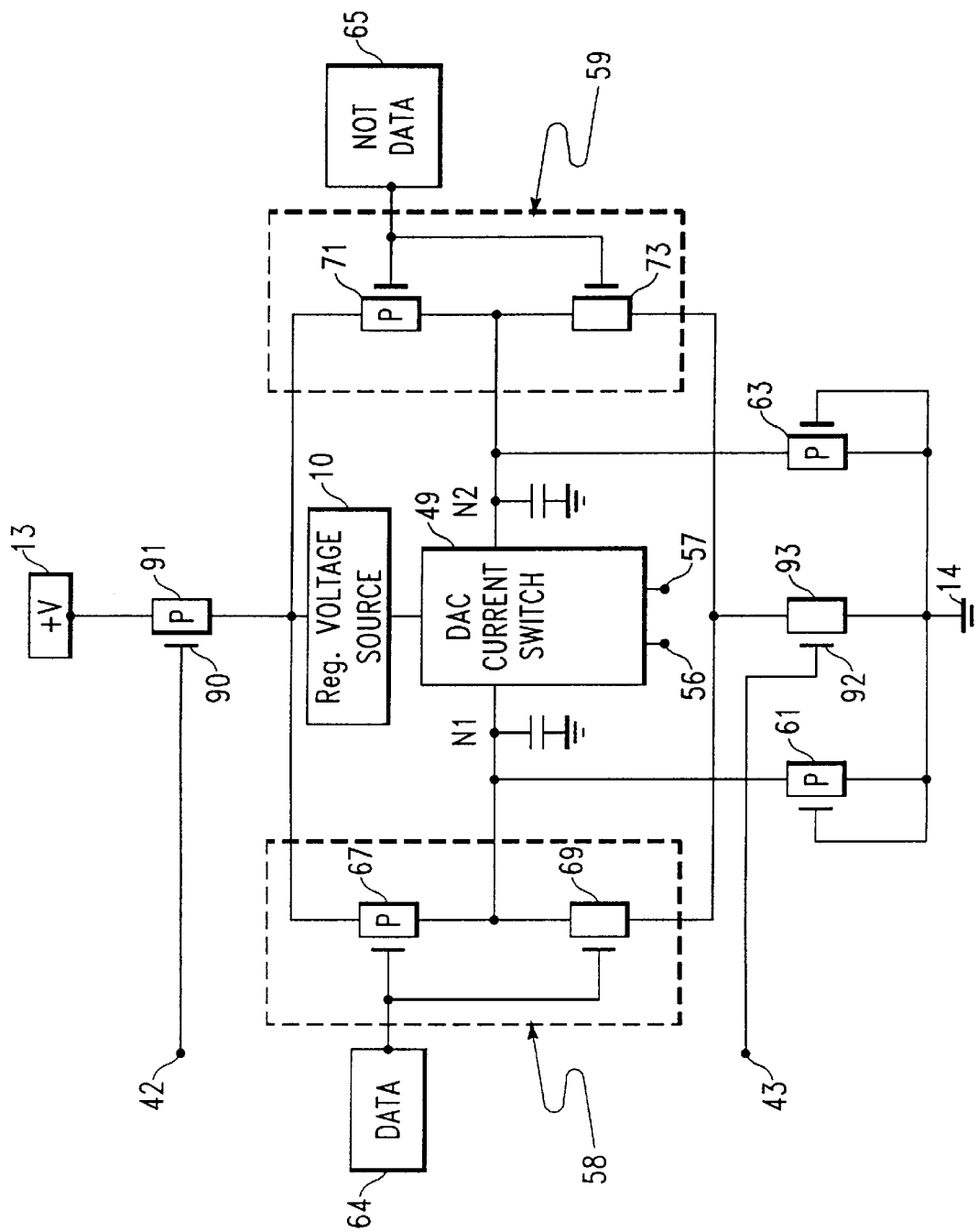
FIG. 3 is a simplified schematic of a different version of the slew rate control circuit shown in FIG. 2.

This regulator circuit uses the internal reference voltage 10 already available within the DAC to generate at least two discrete sets of voltage levels and feeds these sets of voltages to the slew rate control circuit of the invention as shown in FIGS. 2 and 3. The particular set of voltage levels to be generated is dependent on the state of an input from a programmable control register 11 which is part of the video system architecture. The signals from register 11 are applied to the gates or control electrodes 15 and 16 of a pair of complementary field effect transistors (FETS) 17 and 18, respectively. These transistors are coupled in series between a positive voltage source 13, usually about 3 volts, and analog ground 14. The common node 19 between transistors 17 and 18 is connected to the gate 20 of a p-type switching transistor 21. Transistor 21 is in series with a P-type transistor 23, coupled to voltage source 13, and with an N-type transistor 25 coupled to ground 14. A common node 45 between transistors 21 and 25, is connected to output 43. Transistor 23 is controlled by the internal reference voltage source 10 coupled to its gate 22. The internal reference voltage source 10 is also coupled to the gate 26 of P-type transistor 27 which is coupled to the voltage source 13 and is in series with an N-type transistor 29 coupled to ground 14. The common junction node 44 between transistors 27 and 29 is also connected to the gates 24 and 40 of N-type transistors 25 and 41, respectively, and to the output 43 via node 46.

The gate 28 of N-type transistor 29 is commonly connected to the gate 30, of N-type transistor 31 and to the gate 32 of P-type transistor 33 and to the DAC sleep signal source 12. The transistors 31 and 33 are serially coupled between the voltage source 13 and ground 14 and have a common node 34 therebetween which is coupled to the gate 36 of a P-type transistor 37. Transistor 37 has its source coupled to the voltage source 13 and its drain coupled to the gate 38 of P-type transistor 39 and to the output 42 and through N-type transistor 41 to ground 14. Transistor 39 is also coupled to output 42 and through transistor 41 to ground 14.

This circuit has three modes of operation, each of which will be described below.

In the first mode it will be assumed that a low signal is available from register 11 and that the regulated voltage source 10 is low and the DAC sleep signal source 12 is high. The regulated voltage from source 10 biases the transistors 23 and 27 to their turn on-state and transistor 27 begins to conduct current supplying it to node 44. However, because transistor 21 is not biased on, current does not flow through transistor 23. The high DAC sleep signal from source 12 biases the gate 32 of P-type transistor 33 off and simultaneously biases N-type transistors 29 and 31 on. When transistors 29 and 31 both turn on, the nodes 34 and 44 are both pulled towards ground. When the voltage on node 34 falls, transistor 37 turns on passing current to the output 42 and simultaneously biases the gate 38 of transistor 39 to turn transistor 39 off. When transistor 29 turns on, the gates 24 and 40 of transistors 25 and 41 respectively are pulled low and transistors 25 and 41 turn off. When transistor 41 turns off, the output 42 rises towards the voltage source 13 because it receives all the current passing through transistor 37. On the other hand, all the current supplied to nodes 44 and 46 and to output 43 via transistor 27 is diverted to ground through transistor 29 and nodes 44, 45, and 46 and output 43 are all pulled low, i.e., towards ground.

In both the second and third modes it will be assumed that the regulated voltage source 10 remains low, keeping transistors 23 and 27 on. Simultaneously the sleep signal source 12 is brought low turning on transistor 33 and turning off transistors 29 and 31. With transistor 31 turned off, node 34 is biased positive by transistor 33. With transistor 29 turned off nodes 44, 45, and 46 and output 43 rise due to the turning on of transistor 27. With transistor 31 turned off, transistor 33 pulls node 34 high turning off transistor 37 which in turn causes transistor 39 to turn on and pull output node 42 towards source 13. Because transistor 27 is on, current flows through it to nodes 44, 45, and 46 and to output 43. This biases the gates 24 and 40 of transistors 25 and 41 positive and turns transistors 25 and 41 on. When transistor 25 turns on, it holds the nodes 44, 45, and 46 and output 43 at a predetermined voltage. Simultaneously when transistor 41 turns on, output 42 is pulled low, limited by transistor 39. Thus outputs 42 and 43 are both set to predetermined voltage levels by transistors 39 and 25 respectively. It should be noted that the amount of current permitted to flow through transistors 25 and 39 is based on the voltage applied to the gate of transistor 27 and the gate of transistor 23 (when it is conducting) and their size. The voltage level to which the output 43 is pulled to is established by the size of transistor 25 and the current through it. The current level through transistor 25 is mirrored in transistor 41 and the current flow thus established in transistor 41 controls the current flow in transistor 39. The voltage level to which output 42 is pulled is established by the size of transistors 41 and 39 and by the voltage on output 43. Thus the output 42, with respect to voltage source 13, and output 43, with respect to ground 14, provide reference voltages suitable to establish currents in P-type and N-type transistors respectively.

The register 11 is selectively programmed to provide either a "1" or a "0" depending on the video system architecture. The register has a "1" or high output when the circuit is used with a fast transition time usually ranging between 1.5 and 2.5 nanoseconds. The register 11 has a "0" or low output when it is used with a slow transition time that typically ranges between 9 and 11 nanoseconds.

To continue with the description of operation of this circuit in this second mode it will be assumed that a "1", i.e., a high signal, is now received from register 11. With receipt of this "1" from register 11, transistor 17 is turned off and transistor 18 turns on to pull node 19 low or towards ground. Thus transistors 17 and 18 form an inverter circuit. When node 19 goes low it causes transistor 21 to turn on.

When transistor 21 turns on it places transistor 23 in parallel with transistor 27 and permits additional current to flow to nodes 44, 45 and 46 and output 43. As noted above the current flow through transistor 25 is mirrored in transistor 41. The current in transistor 41 flows in transistor 39. The additional current flow through transistors 21 and 23 increases the voltage on node 44 applying greater gate bias to transistors 25, 41 and 39.

For the above-described second mode conditions the output 42 is pulled lower by transistor 41 as the output 43 is driven higher by the additional current supplied to it through transistors 21 and 23. In this second case both output 42 with respect to voltage source 13 and output 43 with respect to ground 14 will increase in voltage causing the currents to increase in transistors connected in parallel with transistors 25 and 39.

In the third mode it will again be assumed that the regulated voltage source 10 remains low, keeping transistors 23 and 27 on, and that simultaneously the sleep signal source 12 is low keeping transistor 33 turned on and transistors 29 and 31 turned off. With transistor 33 on, node 34 is high, transistor 37 is off and transistor 39 is on limiting the voltage at output node 42 with respect to voltage source 13. Because transistor 27 is on, current still flows through it to output 43 and to node 44 thereby biasing the gates 24 and 40 of transistors 25 and 41 positive which turns on transistors 25 and 41. Now however it will be assumed that a "0", i.e., a low signal, is received from register 11. With receipt of this "0" signal from register 11, transistor 17 turns on and transistor 18 turns off causing node 19 to rise which turns transistor 21 off. When transistor 21 turns off it prevents current flow through transistor 23 and the only current flowing to output 43 is that passing through transistor 27 and thus the voltage at output 43, with respect to ground, is reduced. This causes the current in transistors 41 and 39 to reduce causing the voltage at output 42, with respect to voltage source 13, to reduce by a corresponding amount. Since transistor 21 is off, no additional current flows and no additional bias is applied to the gates 24 and 40 of transistors 25 and 41. Thus the current flowing through them is limited by their size and the voltage applied to their gates by the current flowing through transistor 27. Thus the transistors 25 and 41 again limit the current flowing to the outputs 42 and 43. Again the outputs 42 and 43 are pulled to levels determined by the amount of current permitted to flow through the respective current limiting transistors 25 and 39.

It should be noted that in cases two and three, discussed above, there is a current flowing into the outputs 42 and 43 establishing selected voltages at the outputs 42 and 43 but that the levels of these selected voltages are dependent on the mode of operation of this slew rate control regulator circuit as described above.

The control regulator circuit of FIG. 1 generates several different sets of voltages to the outputs 42 and 43 and at least two sets of these levels are controlled by the different register inputs. The way that these sets of voltage levels can be used to control the slew rate of the DAC outputs will now be described in conjunction with FIGS. 2 and 3 as set forth below.

The circuit shown in FIG. 2 controls the slew rate of the DAC by modifying the magnitude of the charging current to the capacitive load on inputs of the DAC current switch providing the outputs of the DAC. FIG. 2 shows a DAC current switch 49 comprised of p-type transistors 51, 53, and 55 with resistively loaded true and compliment outputs 56 and 57. Gate 50 of transistor 51 is coupled to the reference voltage source 10 while the gates 52 and 54 of transistors 53 and 55 are coupled through respective nodes N1 and N2 to the outputs of inverter circuits 58 and 59. The inputs of these inverters 58 and 59 are coupled to respective data inputs 64 and 65. The gates 52 and 54 of transistors 53 and 55 are also coupled to analog ground 14 through respective clamping transistors 61 and 63 whose respective gates 60 and 62 are also coupled to ground 14.

Each of the inverters circuits 58 and 59 are formed of a pair of complementary transistors. Thus inverter 58 is comprised of a P-type transistor 67 and an N-type transistor 69. The respective gates 66 and 68 of these transistors 67 and 69 are coupled together and to a DATA port 64. Similarly inverter 59 is comprised of a P-type transistor 71 and an N-type transistor 73 whose respective gates are coupled together and to a NOT DATA port 65. Inverter 58 is further coupled to voltage source 13 through a voltage controlled P-type control current source transistor 75 and to ground 14 through a voltage controlled N-type current source transistor 77. The respective gates 74 and 76 of these transistors 75 and 77 are respectively coupled to the outputs 42 and 43 of the regulator control circuit of FIG. 1. Thus inverter 58 and the current source transistors 75 and 77 form one leg of the circuit.

Inverter 59 is coupled to voltage source 13 through a voltage controlled P-type current source transistor 79 and to ground 14 through a voltage controlled N-type current source transistor 81. The respective gates 78 and 80 of these transistors 79 and 81 are also respectively coupled to the outputs 42 and 43 of the circuit of FIG. 1. Thus inverter 59 and transistors 79 and 81 form a second leg of the circuit.

The DAC current switch in conjunction with the inverters 58 and 59 induces a significant amount of capacitance on the nodes N1 and N2 and this induced capacitance affects the rate of change of voltage on the gates 52 and 54 of the DAC current switch transistors 53 and 55 respectively which significantly affects the slew rate of the DAC current transitions appearing on the DAC outputs 56 and 57. It is therefore apparent that it is desirable that the capacitances on these nodes N1 and N2 be charged at a controlled rate during all data transfers. This is accomplished by the above described slew rate control circuit, of the present invention, which operates as follows.

As noted previously, the register 11 is programmed to provide either a "1" or a "0" depending on the video system being employed. Thus the control regulator provides, at outputs 42 and 43, one of the above described sets of voltages. These outputs are now coupled to the circuit of FIG. 2 so as to apply selected voltages to the gates of transistors 75, 77, 79, and 81. With the application of these voltages each of these devices are turned on. Although turned on, these transistors 75, 77, 79, and 81 are not conducting because the inverters 58 and 59 are not conducting.

Now when a DATA signal, from a suitable source, (not shown) is applied to input 64 and simultaneously a NOT DATA signal, from a suitable source, (not shown) is applied to input 65, one of the inverter transistors in each inverter turns on. When this occurs, one of the current source transistors 75, 77, 79, and 81 in each leg of the circuit begins to conduct. Thus each leg applies a predetermined current to nodes N1 and N2 to charge the capacitance on these nodes. By controlling the charging of these capacitances, the DAC current switch transistors 53 and 55 are less rapidly turned on and the harmonic content of the video signal is reduced.

For purposes of this example it will be assumed that the DATA signal goes high, and the NOT DATA signal goes low. With the application of a high DATA signal to the inverter 58, the P-type transistor 67 is held off and the N-type transistor 69 turns on allowing a controlled current to pass through transistor 77 and drawing the node N1 and hence the gate 52 of transistor 53 towards ground 14. The amount of current flowing through transistor 77 is established by its size as well as the amount of bias applied to its gate 76 by the output 43 provided by the regulator circuit of FIG. 1. With the application of this bias on its gate 52, transistor 53 turns on pulling current through transistor 51 and the DAC current switch output 56 rises towards source 13.

Simultaneously the application of the low NOT DATA signal to inverter 59 causes the P-type transistor 71 to turn on and the N-type transistor 73 to remain off. With the turning on of transistor 71, current begins flowing through transistor 79 to charge the capacitance on the gate 54 of transistor 55 and pull up the node N2. This causes the gate 54 of transistor 55 to rise and turn transistor 55 off causing the DAC output 57 to be pulled low by its resistive loading. It should be noted that the amount of voltage bias that can be applied through the inverter transistor 71 is limited because it is clamped by transistor 63. This up level clamping of the inverter output reduces the input voltage coupling to the analog output and results in a cleaner output waveform.

With the application of a low DATA signal and a high NOT DATA signal the situation is reversed and output 56 goes low and output 57 goes high. In this case the up level of inverter 58 would be clamped by transistor 61 for the reasons discussed above.

The circuit described in FIG. 2 above is particularly useful when the load capacitance on the gates 52 and 54 is light. When this capacitive load is significant, the circuit configuration shown in FIG. 3 gives improved results.

FIG. 3 shows the circuit of FIG. 2 adapted for when the load capacitance on the gates 52 and 54 is heavy.

This circuit is substantially identical to the circuit of FIG. 2 except that the current source transistors 75 and 79 have been replaced by a single current source transistor 91 and the current source transistors 77 and 81 have been replaced by a single transistor 93.

This circuit operates in a manner identical to the operation of the circuit shown in FIG. 2.

FIG. 3 also shows the DAC current switch 49 and the respective inverters 58 and 59 coupled to respective data inputs 64 and 65. The outputs of these inverters are coupled to the inputs of the DAC current switch 49 through clamping transistors 61 and 63 to analog ground 14. Again each of the inverters 58 and 59 are formed of a pair of complementary transistors whose gates are coupled together and respectively to DATA port 64 and to NOT DATA port 65. Inverters 58 and 59 are further coupled to voltage source 13 through P-type transistor 91 and to ground 14 through N-type transistor 93. The respective gates 90 and 92 of these transistors are respectively coupled to the outputs 42 and 43 of the circuit of FIG. 1.

As noted previously, the register 11 is programmed to provide either a "1" or a "0" depending on the video system being employed. Thus the control regulator outputs 42 and 43 applied to this rate control circuit has a selected current applied thereto so as to apply a selected bias to the gates of transistors 91 and 93. Both of these devices have a sufficient gate bias to be turned on but are not conducting because neither of the devices in either of the inverters 58 and 59 are yet conducting.

Now when a DATA signal is applied to input 64 and simultaneously a NOT DATA signal is applied to input 65, one transistor in each inverter turns on and both the transistors 91 and 93 begin to conduct and to pass current to charge the capacitance at the inputs of DAC current switch 49 causing the transistors in the DAC current switch to switch more slowly and reduce the harmonic content of the video signal.

For purposes of this example it will be assumed that the DATA signal goes high, i.e., positive and the NOT DATA signal goes low, i.e., negative. With the application of a high DATA signal to the inverter 58, the P-type transistor 67 is held off and the N-type transistor 69 turns on drawing a controlled current through transistor 93 and drawing the gate 52 of transistor 53 towards ground 14. The amount of current flowing through transistor 93 is established by the amount of bias applied to its gate 92 by the output provided by the regulator circuit of FIG. 1. With the application of this bias on its gate 52, transistor 53 turns on pulling current through transistor 51 and the DAC current switch output 56 rises towards source 13.

Simultaneously, in inverter 59, the P-type transistor 71 turns on and the N-type transistor 73 remains off. With the turning on of transistor 71, current begins flowing through transistor 91 to charge the capacitance on the gate 54 of transistor 55 and to pull up the gate 54 of transistor 55 to turn transistor 55 off and thus the DAC output 57 goes low. It should be noted that the up level applied by the inverter in this case is again clamped by transistor 63. Again this up level clamping of the inverter output reduces the input voltage coupling to the analog output and results in a cleaner output waveform.

With the application of a low DATA signal and a high NOT DATA signal the situation is reversed and output 56 goes low and output 57 goes high. In this case the up level of inverter 58 would be clamped by transistor 61 for the reasons discussed above.

As mentioned above, this circuit is particularly useful when the load capacitance on the nodes N1 and N2 is significant.

It should be noted that although the preferred embodiment has been described as using FET transistors of a particular type that these types could be interchanged and that bipolar transistors could be substituted for the FET transistors.

It should be further noted that although node 14 is described as ground it could also be a second voltage source such as a negative voltage source.

Thus the invention teaches a noise limited, video, digital to analog converter having an output transition time control with multiple discrete transition times. This is accomplished by providing the convertor with a control circuit in which the slew rate of the current is controlled by providing set current levels in the inverters that drive the DAC output current switches thus limiting the current available for charging and discharging the capacitance on the nodes which controls the output signal. Additional control is provided by voltage clamping of these nodes which reduces the input voltage to the analog output and results in a cleaner output waveform.

It should be understood that although the present invention has been described as being used with a DAC current switch that it can be used in any situation where it is necessary to quickly discharge capacitances.

It is to be further noted that the control regulator circuit of FIG. 1 may be profitably used with circuits other than the DAC circuits described above.

While the invention has been particularly described with respect to a preferred embodiment, it should be understood that one skilled in the art can, from the foregoing, readily make changes in form and detail without departing from the spirit and scope of the invention.

What is claimed is:

1. A slew rate control circuit comprising:
   a pair of inverter circuits;
   each of said inverter circuits comprising first and second transistors and being coupled between current limiting transistors;
   an output current switch comprising a pair of switching transistors, each of said switching transistors being coupled through a respective node to a respective one of said inverter circuits; and
   means, including a current regulator circuit, for providing a set of current levels in the inverter circuits to define the current available for charging and discharging the capacitance on each respective node.

2. The circuit of claim 1 wherein there is further provided:
   voltage clamping means coupled to said nodes to reduce the input voltage required to activate said current switch and provide a cleaner waveform at the output of said current switch.

3. The circuit of claim 1 wherein said means for providing set current levels further includes a regulator circuit comprising:
   first, second, and third current conducting legs;
   first and second voltage outputs;
   said first leg including a first current conducting transistor and a switching transistor, said transistors being of a first conductivity type and in series between said first voltage source and said first voltage output;
   said first leg further including a first current limiting transistor of a second conductivity type coupled between said first voltage output and a second voltage source;
   said second leg including a second current conducting transistor of said first conductivity type coupled to said first voltage output; and
   said third leg including a third current conducting transistor of said first conductivity type coupled between said first voltage source and said second voltage output, and further including a second current limiting transistor of said second conductivity type coupled between said second voltage output and said second voltage source;
   said first voltage output being coupled to control the first current source transistor; and
   said second voltage output being coupled to control the second current source transistor.

4. A circuit comprising:
   a pair of inverters, each having inputs thereto;
   each of said inverter circuits being coupled to a respective current limiting transistor;
   a control circuit means for controlling the slew rate of the current, the circuit further including a current switch which can be coupled via respective nodes to a pair of inverter inputs;
   means including said current limiting transistor for providing set current levels in each inverter coupled to the output current switch to limit the current available for charging and discharging the capacitance on the nodes so as to control the output signal provided by said current switch; and
   a voltage clamping transistor coupled to each of said nodes to reduce the input voltage to the nodes so as to produce a cleaner output waveform.

5. The circuit of claim 4 wherein said means for providing set current levels comprises:
- a first and a second current source transistor of a first conductivity type respectively coupled between and in series with each respective inverter circuit and a first voltage source; and
- a third and a fourth current source transistor of a second conductivity type respectively coupled between and in series with each respective inverter circuit and a second voltage source.

6. The circuit of claim 5 wherein said means further includes a regulator circuit comprising:
- first, second, and third conducting legs; and
- first and second voltage outputs;
- said first leg including a first current conducting transistor and a switching transistor, said transistors being of a first conductivity type and in series between a first voltage source and said first voltage output, and further including a first current limiting transistor of a second conductivity type coupled between said first voltage output and a second voltage source;
- said second leg including a second current conducting transistor of said first conductivity type coupled to said first voltage output; and
- said third leg including a third current conducting transistor of said first conductivity type coupled between said first voltage source and said second voltage output, and further including a second current limiting transistor of said second conductivity type coupled between said second voltage output and said second voltage source;
- said first voltage output being coupled to control the first and second current source transistors; and
- said second voltage output being coupled to control the third and fourth current source transistors.

7. The circuit of claim 6 wherein said first and second current source transistors are P-type field effect transistors and have their gates coupled to said first voltage output and said third and fourth current source transistors are N-type field effect transistors and have their gates coupled to said second voltage output.

8. The circuit of claim 7 wherein there is further provided means for switching said switching transistor from a conductive to a nonconductive state to control the amount of current applied to said first output.

9. The circuit of claim 8 wherein there is further provided means for turning off said first and second current limiting transistors of said second conductivity type and for turning off the third current conducting transistor of said first conductivity type in said third leg.

10. The circuit of claim 7 wherein the first current conducting transistor of said first leg and said second current conducting transistor of said second leg each have their control electrode coupled to a regulated voltage source.

11. The circuit of claim 9 wherein said transistors are field effect transistors.

12. the circuit of claim 9 wherein said transistors are bipolar transistors.

13. A slew rate control circuit comprising:
- a pair of inverter circuits;
- said inverter circuits being coupled through a current limiting transistor to a voltage source;
- an output current switch comprising a pair of switching transistors, each of said switching transistors being coupled through a respective node to a respective one of said inverter circuits; and
- means for providing a plurality of sets of current levels in the inverter circuits to limit the current available for charging and discharging the capacitance on each respective node.

14. A regulator circuit comprising:
- first, second, and third current conducting legs;
- first and second voltage sources; and
- first and second voltage outputs;
- said first leg including a first current transistor and a switching transistor in series between the first voltage source and the first voltage output, and a first current limiting transistor coupled between the first voltage output and the second voltage source;
- said second leg including a second current transistor coupled between the first voltage source and the first voltage output; and
- said third leg including a third current transistor coupled between the first voltage source and the second voltage output, and a second current limiting transistor coupled between the second voltage output and the second voltage source.

15. The regulator of claim 14 wherein there is further provided a regulated voltage source coupled to and controlling said first and second current transistors.

16. The regulator of claim 14 wherein there is further provided a programmable means coupled to and controlling said switching transistor to permit current flow in said first leg.

17. The regulator of claim 16 wherein said switching transistor is coupled to said programmable source through an inverter circuit.

18. A regulator circuit comprising:
- first, second, and third current conducting legs;
- first and second voltage sources;
- first and second voltage outputs;
- said first leg including a first current transistor coupled between the first voltage source and the first voltage output, and a first current limiting transistor coupled between the first voltage output and the second voltage source;
- said second leg including a second current transistor coupled between the first voltage source and the first voltage output; and
- said third leg including a third current transistor coupled between the first voltage source and the second voltage output, and a second current limiting transistor coupled between the second voltage output and the second voltage source; and
- means for selectively switching said first leg into parallel to said second leg to vary the current applied to said first output.

19. The regulator circuit of claim 18 where said means for selectively switching said first leg comprises a switching transistor in series with said first current transistor and means of selectively switching said switching transistor from a conductive to a non-conductive state.

20. The circuit of claim 19 wherein there is further provided means for turning off said third and fourth current limiting, voltage controlled transistor and for turning off the current conducting transistor in said third leg.

21. The circuit of claim 16 wherein the first current conducting transistor of said first leg and said second current conducting transistor of said second leg each have their control electrode coupled to a regulated voltage source.

22. the circuit of claim 19 wherein said transistors are field effect transistors.

23. the circuit of claim 19 wherein said transistors are bipolar transistors.

* * * * *